US012805328B2

(12) United States Patent
Lin et al.

(10) Patent No.: US 12,805,328 B2
(45) Date of Patent: Nov. 17, 2026

(54) SEMICONDUCTOR STRUCTURE HAVING DUMMY ACTIVE REGION

(71) Applicant: Winbond Electronics Corp., Taichung City (TW)

(72) Inventors: Ming-Che Lin, Taichung City (TW); Chien-Chin Huang, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 402 days.

(21) Appl. No.: 18/495,989

(22) Filed: Oct. 27, 2023

(65) Prior Publication Data

US 2024/0145409 A1 May 2, 2024

(30) Foreign Application Priority Data

Oct. 28, 2022 (TW) ................................ 111141124

(51) Int. Cl.
*H10W 42/00* (2026.01)
*H10D 30/60* (2025.01)
*H10D 89/10* (2025.01)

(52) U.S. Cl.
CPC .......... *H10W 42/121* (2026.01); *H10D 30/60* (2025.01); *H10D 89/10* (2025.01)

(58) Field of Classification Search
CPC ..... H10W 42/121; H10D 30/60; H10D 89/10; H01L 23/562; H01L 29/78; H01L 27/0207
See application file for complete search history.

(56) References Cited

U.S. PATENT DOCUMENTS

| | | | | |
|---|---|---|---|---|
| 11,854,863 | B2 * | 12/2023 | Chen | H10D 62/021 |
| 12,453,097 | B2 * | 10/2025 | Kim | H10B 43/50 |
| 2009/0121296 | A1 * | 5/2009 | Kwon | H10P 95/062<br>257/E27.07 |
| 2011/0156149 | A1 * | 6/2011 | Wang | H10P 95/90<br>257/E21.546 |
| 2012/0292712 | A1 * | 11/2012 | Baek | H10D 89/10<br>257/E27.06 |
| 2016/0027778 | A1 * | 1/2016 | Moriwaki | H10D 84/85<br>257/401 |
| 2021/0057409 | A1 | 2/2021 | Chuang et al. | |
| 2021/0175232 | A1 * | 6/2021 | Nam | H10D 84/83 |
| 2022/0320131 | A1 * | 10/2022 | Kim | H10B 43/50 |

* cited by examiner

*Primary Examiner* — Andres Munoz
(74) *Attorney, Agent, or Firm* — MUNCY, GEISSLER, OLDS & LOWE, P.C.

(57) ABSTRACT

A semiconductor structure includes a first active region, a first dummy active region and a second dummy active region, and a first gate structure extending over the first active region in a first direction. The first active region has a first edge extending in the first direction, and a second edge connected to the first edge and extending in a second direction. The first dummy active region has a first edge extending in the first direction and immediately adjacent to the first edge of the first active region. The second dummy active region has a first edge extending in the second direction and immediately adjacent to the second edge of the first active region.

17 Claims, 7 Drawing Sheets

SEMICONDUCTOR STRUCTURE HAVING DUMMY ACTIVE REGION

CROSS REFERENCE TO RELATED APPLICATIONS

This Application claims priority of Taiwan Patent Application No. 111141124, filed on Oct. 28, 2022, the entirety of which is incorporated by reference herein.

BACKGROUND OF THE INVENTION

Field of the Invention

The present invention relates to semiconductor structures, and, in particular, to semiconductor structures having dummy active regions.

Description of the Related Art

Manufacturers continue to scale down the dimensions of semiconductor devices by increasing the device density of said devices in an effort to improve their overall performance and portability, but many challenges arise in the manufacturing technology used for such miniaturization. The main factors affecting the design function and device performance include the lithography process, the etching process, the chemical mechanical polishing process and film stress. The space between the active regions may vary based on design requirements. Such variations in spacing can cause changes to features such as shallow trench isolation (STI) induced stress, the sidewall profile, and the like, thereby affecting the performance of devices (e.g., metal-oxide-semiconductor field-effect transistors (MOSFETs) formed over the active regions. For example, due to the characteristics of the etching process (e.g., the etch loading effect), the greater the difference in spaces between the active regions, the greater the difference in the sidewall angles of the active regions. Therefore, the dopants implanted in different active regions may also have large differences in concentration and depth, resulting in large differences in performance (for example, threshold voltage (Vt)) between transistors formed over the active regions.

To solve this problem, dummy patterns are typically included between devices to improve loading uniformity in the manufacturing process. However, with the scaling down of these devices, it's hard to achieve the target of loading uniformity by using existing dummy patterns. This can affect the characteristics of semiconductor devices.

BRIEF SUMMARY OF THE INVENTION

An embodiment of the present invention provides a semiconductor structure, which can improve the loading uniformity of the semiconductor structures so that the characteristics of the semiconductor structure meet expectations.

An embodiment of the present invention provides a semiconductor structure. The semiconductor structure comprises a first active region, a first gate structure, a first dummy active region, and a second dummy active region. The first active region is disposed over a substrate. The first active region has a first edge and a second edge. The first edge extends in a first direction. The second edge is connected to the first edge. The second edge extends in a second direction. The first direction and the second direction are perpendicular. The first gate structure extends over the first active region in the first direction. The first dummy active region is disposed over the substrate. The first dummy active region has a first edge extending in the first direction and immediately adjacent to the first edge of the first active region. The second dummy active region is disposed over the substrate. The second dummy active region has a first edge extending in the second direction and immediately adjacent to the second edge of the first active region.

An embodiment of the present invention provides a semiconductor structure. The semiconductor structure comprises a first active region, a dummy active region, and a second active region arranged in sequence over a substrate in the first direction. The semiconductor structure also comprises a first gate structure, a second gate structure, and a first dummy gate structure. The first gate structure extends over the first active region in a second direction. The second gate structure extends over the second active region in the second direction. The first dummy gate structure extends over the dummy active region in the second direction. The length of the first dummy gate structure in the second direction is longer than the length of the first dummy active region in the second direction.

DETAILED DESCRIPTION OF THE INVENTION

The following description is made for the purpose of illustrating the general principles of the invention and should not be taken in a limiting sense. The scope of the invention is best determined by reference to the appended claims.

An embodiment of the present invention uses the dummy active regions immediately adjacent to the periphery of the active regions to improve the pattern density during the etching process for forming the active regions, thereby reducing the variation of the sidewall angle between the active regions. Therefore, the difference in performance between transistors formed over different active regions is improved. In particular, the electrical property of low-voltage device will be more stable by adopting the invention.

Figure 1A:
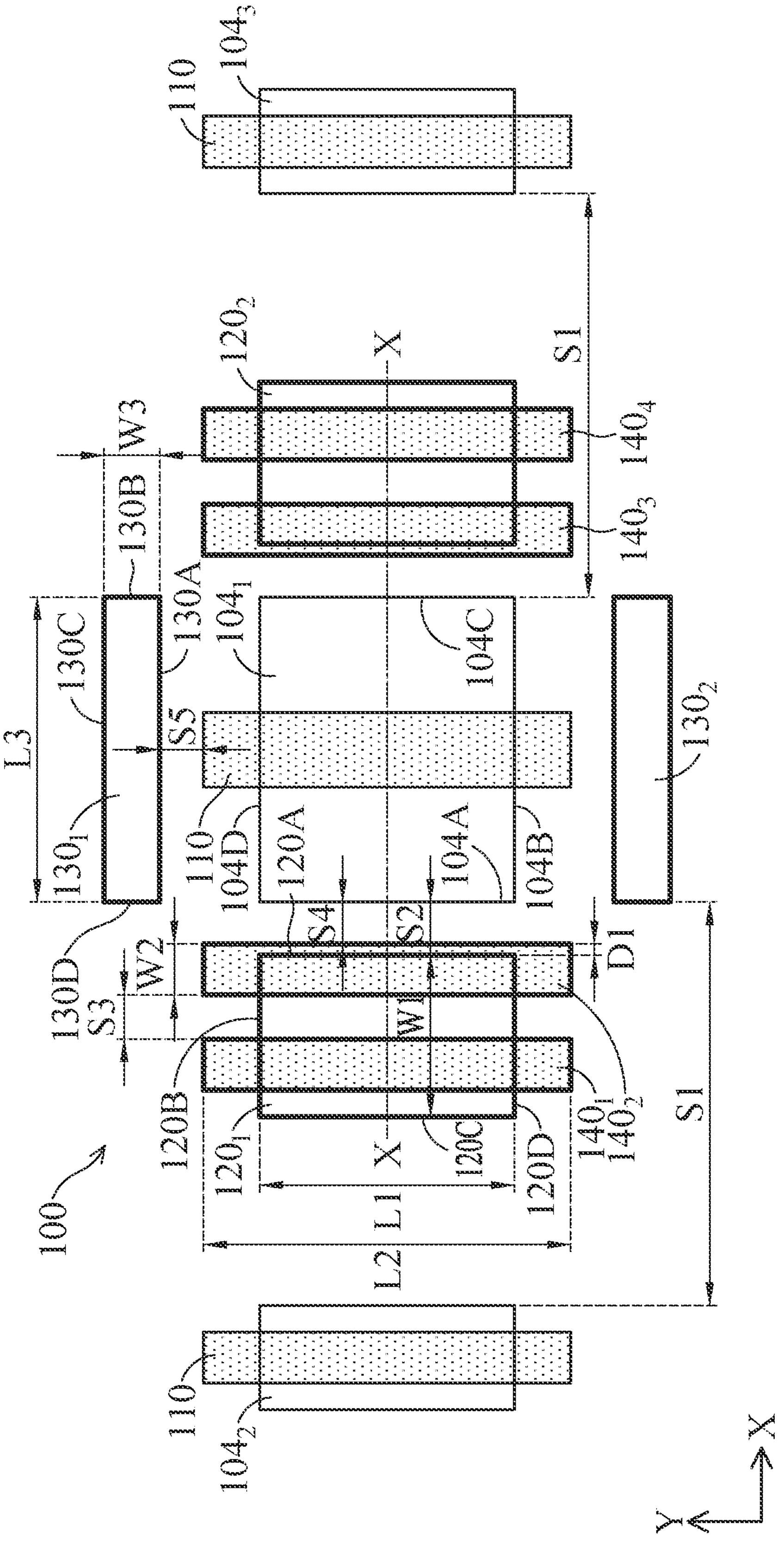
FIG. 1A shows a plan view illustrating a semiconductor structure according to some embodiments of the present invention.
Figure 1B:
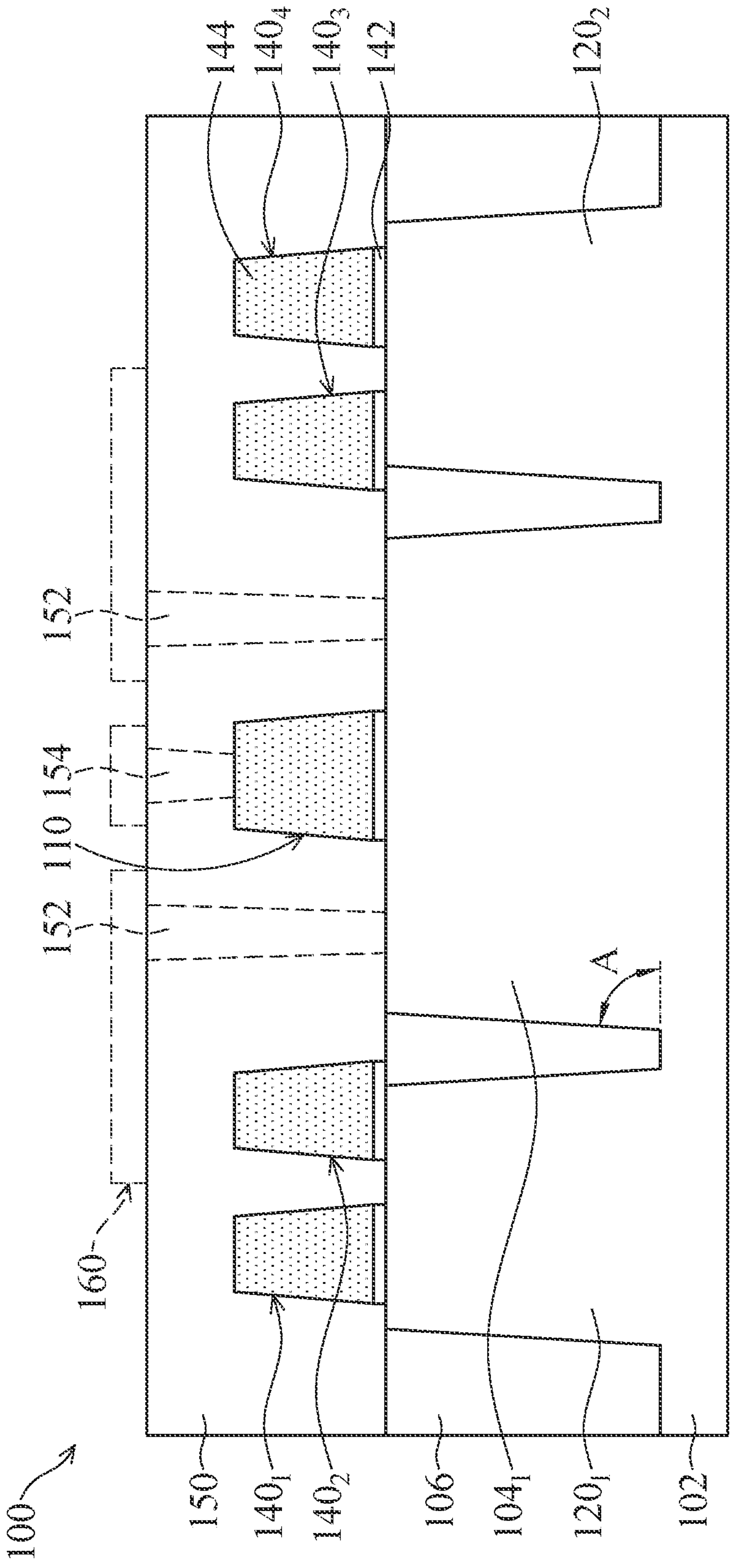
FIG. 1B shows a cross-sectional view illustrating a semiconductor structure according to some embodiments of the present invention.

FIG. 1 shows a plan view illustrating a semiconductor structure 100 according to some embodiments of the present invention. FIG. 1B shows a plan view of the semiconductor structure 100 taken from the X-X line of FIG. 1A according to some embodiments of the present invention. For clarity, some elements of the semiconductor structure 100 are not shown in FIG. 1A, but can be seen in FIG. 1B.

The semiconductor structure 100 includes the active regions $\mathbf{104}_1$, $\mathbf{104}_2$, $\mathbf{104}_3$, a gate structure 110, the dummy active regions $\mathbf{120}_1$, $\mathbf{120}_2$, $\mathbf{130}_1$, $\mathbf{130}_2$, and the dummy gate structures $\mathbf{140}_1$, $\mathbf{140}_2$, $\mathbf{140}_3$, $\mathbf{140}_4$. The active regions $\mathbf{104}_1$, $\mathbf{104}_2$, $\mathbf{104}_3$, and the dummy active regions $\mathbf{120}_1$, $\mathbf{120}_2$, $\mathbf{130}_1$, $\mathbf{130}_2$ are formed in the substrate 102. The substrate 102 may be an elementary semiconductor substrate, such as a silicon substrate, or a germanium substrate; or a compound semiconductor substrate, such as a silicon carbide substrate, or a gallium arsenide substrate. In some embodiments, the semiconductor substrate 102 may be a semiconductor-on-insulator (SOI) substrate.

The active region $104_1$ (also referred to as a first active region) may have sloped sidewalls. The sidewall of the active region $104_1$ intersects the plane parallel to the top surface of the substrate 102 at an angle A (also referred to as the sidewall angle), as shown in FIG. 1B. In some embodiments, the active region $104_1$ is defined in the open region. When the distance between the active region $104_1$ and the immediately adjacent active region (such as the active region $104_2$ or $104_3$) is greater than a predetermined value, the dummy active regions $120_1$, $120_2$, $130_1$, $130_2$ are disposed around the active region $104_1$.

Since the etching amount is affected by the pattern density of the etching mask during the etching process for forming the active region, the active regions at different locations may be formed to have different sidewall angles due to the difference in pattern density. Therefore, disposing of the dummy active region can reduce the difference in the pattern density of the etching mask at different positions, thereby improving the difference in the sidewall angle between the active regions. Therefore, the difference in performance between the formed transistors can be improved.

The isolation structure 106 is formed to surround the active regions $104_1$, $104_2$, $104_3$ and the dummy active regions $120_1$, $120_2$, $130_1$, $130_2$. The isolation structure 106 is used to electrically isolate those active regions and/or dummy active regions. The isolation structure 106 may be formed from a dielectric material, such as silicon oxide (SiO), silicon nitride (SiN), or silicon oxynitride (SiON).

The gate structure 110 is formed over the active regions $104_1$, $104_2$, and $104_3$. In the long axis direction of the gate structure 110, the gate structure 110 can extend beyond the active regions $104_1$, $104_2$, and $104_3$. Although FIGS. 1A and 1B show that one gate structure formed over one active region, the number of gate structures over one active region can be more than one depending on design requirements.

The portions of the active regions $104_1$, $104_2$, and $104_3$ covered by the gate structure 110 (or overlapping with the gate structure 110) are used as channel regions. The portions of the active regions $104_1$, $104_2$, and $104_3$ at opposite sides of the gate structure 110 (that is the portions not covered by the gate structure 110) serve as source/drain regions. The gate structure 110 and the adjacent source/drain regions can form a transistor.

Dummy gate structures $140_1$, $140_2$ are formed over the dummy active region $120_1$, and dummy gate structures $140_3$, $140_4$ are formed over the dummy active region $120_2$. Although FIGS. 1A and 1B show that two dummy gate structures are formed over one dummy active region, the number of dummy gate structures over one dummy active region may depend on the size of the dummy active region without limitation. In other embodiments, the dummy gate structure may not be formed over the dummy active region, but formed over the isolation structure 106.

Each of the gate structure 110 and the dummy gate structures $140_1$, $140_2$, $140_3$, $140_4$ extends in the Y direction and includes a gate dielectric layer 142 and a gate electrode layer 144 over the gate dielectric layer 142. The gate dielectric layer 142 may be formed from a dielectric material, such as silicon oxide (SiO), silicon nitride (SiN), silicon oxynitride (SiON), or other suitable materials. The gate electrode layer 144 may be formed from a polysilicon or metal materials (for example, tungsten (W), titanium (Ti), aluminum (Al), copper (Cu), molybdenum (Mo), nickel (Ni), platinum (Pt), or other suitable metal materials).

The formation of the gate structure 110 and the dummy gate structures $140_1$, $140_2$, $140_3$, $140_4$ includes depositing materials for the gate dielectric layer 142 and the gate electrode layer 144, followed by a patterning process for these materials (for example, including lithography and etching processes). In this embodiment, by incorporating the dummy gate structure, the difference of the etching mask pattern density at different positions can be reduced, thereby improving the difference of the sidewall angle between the gate structures. Therefore, the difference in performance between the formed transistors can be improved.

An interlayer dielectric layer 150 is formed over the active regions $104_1$, $104_2$, and $104_3$, the gate structure 110, the dummy active regions $120_1$, $120_2$, $130_1$, $130_2$, and the dummy gate structures $140_1$, $140_2$, $140_3$, $140_4$. The interlayer dielectric layer 150 may be formed from a dielectric material. The semiconductor structure 100 further includes contact plugs 152, 154 formed in the ILD layer 150, and an interconnect structure 160 formed over the ILD layer 150 and the contact plugs 152, 154. The contact plugs 152, 154 and the interconnect structure 160 are shown by dotted lines in FIG. 1B, indicating that they may not be located exactly in the cross-section, but in other cross-sections behind or in front of FIG. 1B.

The contact plug 152 is over the top surface of the source/drain region of the active region $104_1$, and the contact plug 154 is over the top surface of the gate electrode layer 144 of the gate structure 110. The interconnect structure 160 may include one or more metal layers. The interconnection structure 160 is electrically connected to the source/drain region of the active region $104_1$ through the contact plug 152 and electrically connected to the gate electrode layer 144 of the gate structure 110 through the contact plug 154. Transistors over different active regions can be electrically coupled to each other through the contact plugs 152, 154 and the interconnect structure 160. The contact plugs 152, 154 and the interconnect structure 160 may be formed from metals such as tungsten (W), titanium (Ti), aluminum (Al), copper (Cu), molybdenum (Mo), nickel (Ni), platinum (Pt), or other suitable metal materials, metal nitride, and metal silicide.

No contact plugs are disposed over the dummy active regions $120_1$, $120_2$, $130_1$, $130_2$, and no contact plugs are disposed over the dummy gate structures $140_1$, $140_2$, $140_3$, $140_4$ either. Therefore, the dummy active regions $120_1$, $120_2$, $130_1$, $130_2$ and the dummy gate structures $140_1$, $140_2$, $140_3$, $140_4$ are electrically isolated from the interconnect structure 160 and are not electrically coupled to the transistors over the active regions.

The position configuration of the dummy active regions $120_1$, $120_2$, $130_1$, $130_2$, and dummy gate structures $140_1$, $140_2$, $140_3$, $140_4$ will be described below. Please refer to FIG. 1A, the active region $104_1$ and the active region $104_2$ (or the active region $104_3$) are separated by a distance S1 in the X direction. The distance S1 between the active region $104_1$ and the active region $104_2$ may not be equal to the distance S1 between the active region $104_1$ and the active region $104_3$. No other active region is disposed between the active region $104_1$ and the active region $104_2$ (or the active region $104_3$). In some embodiments, the distance S1 is, for example, greater than or equal to a first predetermined value.

The active region $104_1$ has a rectangular profile in a plan view, and has four edges 104A, 104B, 104C, and 104D. The edges 104A and 104C extend in the Y direction, while the edges 104B and 104D extend in the X direction. The dummy active regions $120_1$ and $120_2$ arranged in the X direction are respectively disposed nearby the opposite edges 104A and 104C of the active region $104_1$. The dummy active regions $130_1$ and $130_2$ arranged in the Y direction are respectively disposed nearby the opposite edges 104D and 104B of the active region $\mathbf{104}_1$.

The dummy active region $\mathbf{120}_1$ (also referred to as a first dummy active region) is disposed between the active regions $\mathbf{104}_1$ and $\mathbf{104}_2$. No other active region or dummy active region is disposed between the dummy active region $\mathbf{120}_1$ and the active region $\mathbf{104}_1$. The dummy active region $\mathbf{120}_1$ has a rectangular profile in a plan view, and has four edges 120A, 120B, 120C, and 120D. The edges 120A and 120C extend in the Y direction, while the edges 120B and 120D extend in the X direction. The edge 120A of the dummy active region $\mathbf{120}_1$ is adjacent to the edge 104A of the active region $\mathbf{104}_1$. The active region $\mathbf{104}_1$ is separated from the dummy active region $\mathbf{120}_1$ by a distance S2 in the X direction. In some embodiments, the distance S2 is about 0.25 μm. The ratio of the distance S2 to the distance S1 (S2/S1) is smaller than about 0.33, thereby substantially improving the difference of sidewall angles between the active regions and reducing the difficulty of the process.

The edges 120B and 120D of the dummy active region $\mathbf{120}_1$ may be aligned with the edges 104D and 104B of the active region $\mathbf{104}_1$, respectively. That is, the imaginary extension line of the edge 120B is collinear with the imaginary extension line of the edge 104D, and the imaginary extension line of the edge 120D is collinear with the imaginary extension line of the edge 104B. However, in an embodiment not illustrated in the figures, the above-mentioned edges may not be collinear. The dummy active region $\mathbf{120}_1$ has a width of W1 in the X direction and a length of L1 in the Y direction. The length L1 is greater than the width W1. In some embodiments, the width W1 may be greater than or equal to about 0.25 μm, and the length L1 may be greater than or equal to about 0.48 μm.

The dummy active region $\mathbf{120}_2$ is disposed between the active regions $\mathbf{104}_1$ and $\mathbf{104}_3$. The size of the dummy active region $\mathbf{120}_2$ may be similar to the size of the dummy active region $\mathbf{120}_1$ and the configuration relationship between the dummy active region $\mathbf{120}_2$ and the active region $\mathbf{104}_1$ may be similar to the configuration relationship between the dummy active region $\mathbf{120}_1$ and the active region $\mathbf{104}_1$. In addition, additional dummy active regions can be disposed between the dummy active region $\mathbf{120}_1$ and the active region $\mathbf{104}_2$, and/or between the dummy active region $\mathbf{120}_2$ and the active region $\mathbf{104}_3$.

The dummy gate structure $\mathbf{140}_1$ covers the edges 120B, 120D of the dummy active region $\mathbf{120}_1$. The dummy gate structure $\mathbf{140}_2$ covers the edges 120A, 120B, 120D of the dummy active region $\mathbf{120}_1$. The dummy gate structures $\mathbf{140}_1$ and $\mathbf{140}_2$ are separated by a distance S3 in the X direction. The distance S3 is smaller than distance S2. In some embodiments, distance S3 is greater than or equal to about 0.2 μm.

The dummy gate structure $\mathbf{140}_2$ extends over the edge 120A of the dummy active region $\mathbf{120}_1$ by a distance of D1 in the X direction. The distance D1 is, for example, between 0.01 to 0.2 μm. The active region $\mathbf{104}_1$ is separated from the dummy gate structure $\mathbf{140}_2$ by a distance S4 in the X direction. In some embodiments, the distance S4 is smaller than the distance S3, for example, 0.18 μm.

The dummy gate structures $\mathbf{140}_1$ and $\mathbf{140}_2$ have a width of W2 in the X direction and a length of L2 in the Y direction. The length L2 is greater than the width W2. In some embodiments, the width W2 is smaller than the width W1 and greater than or equal to 0.1 μm. In some embodiments, length L2 is greater than length L1 and greater than or equal to 0.5 μm.

The size of the dummy gate structures $\mathbf{140}_3$, $\mathbf{140}_4$ may be similar to the size of the dummy gate structures $\mathbf{140}_1$, $\mathbf{140}_2$, and the configuration relationship between the dummy gate structures $\mathbf{140}_3$, $\mathbf{140}_4$, the dummy active region $\mathbf{120}_2$ and the active region $\mathbf{104}_1$ may be similar to the configuration relationship between the dummy gate structures $\mathbf{140}_1$, $\mathbf{140}_2$, the dummy active region $\mathbf{120}_1$ and the active region $\mathbf{104}_1$.

The dummy active region $\mathbf{130}_1$ (also referred to as a second dummy active region) has a rectangular profile in a plan view, and has four edges 130A, 130B, 130C, and 130D. The edges 130A and 130C extend in the X direction, while the edges 130B and 130D extend in the Y direction. The edge 130A of the dummy active region $\mathbf{130}_1$ is adjacent to the edge 104D of the active region $\mathbf{104}_1$ and the edge of the gate structure 110. No other active region or dummy active region is disposed between the dummy active region $\mathbf{130}_1$ and the active region $\mathbf{104}_1$. The dummy active region $\mathbf{130}_1$ is separated from the gate structure 110 by a distance S5 in the Y direction. The distance S5 is greater than distance S4 and may be equal to the distance S2. In some embodiments, the ratio of the distance S5 to the distance S1 (S5/S1) is less than about 0.33, thereby improving the sidewall angles difference between the active regions and the leakage current between the gate structure 110 and the dummy active region $\mathbf{130}_1$ is avoided.

The edge 130D of the dummy active region $\mathbf{130}_1$ may (or may not) be aligned with the edge 104A of the active region $\mathbf{104}_1$. The edge 130B of the dummy active region $\mathbf{130}_1$ may (or may not) be aligned with the edge 104C of the active region $\mathbf{104}_1$. The dummy active region $\mathbf{130}_1$ has a length of L3 in the X direction and a width of W3 in the Y direction. The length L3 is greater than the width W3. In some embodiments, the width W3 is greater than or equal to about 0.25 μm and the length L3 is greater than or equal to about 0.5 μm.

The size of the dummy active region $\mathbf{130}_2$ may be similar to the size of the dummy active region $\mathbf{130}_1$ and the configuration relationship between the dummy active region $\mathbf{130}_2$ and the active region $\mathbf{104}_1$ may be similar to the configuration relationship between the dummy active region $\mathbf{130}_1$ and the active region $\mathbf{104}_1$. In addition, although not shown, the dummy active regions and the dummy gate structures having configurations similar to those described above may be disposed over the periphery of the active regions $\mathbf{104}_2$ and/or $\mathbf{104}_3$.

Figure 2:
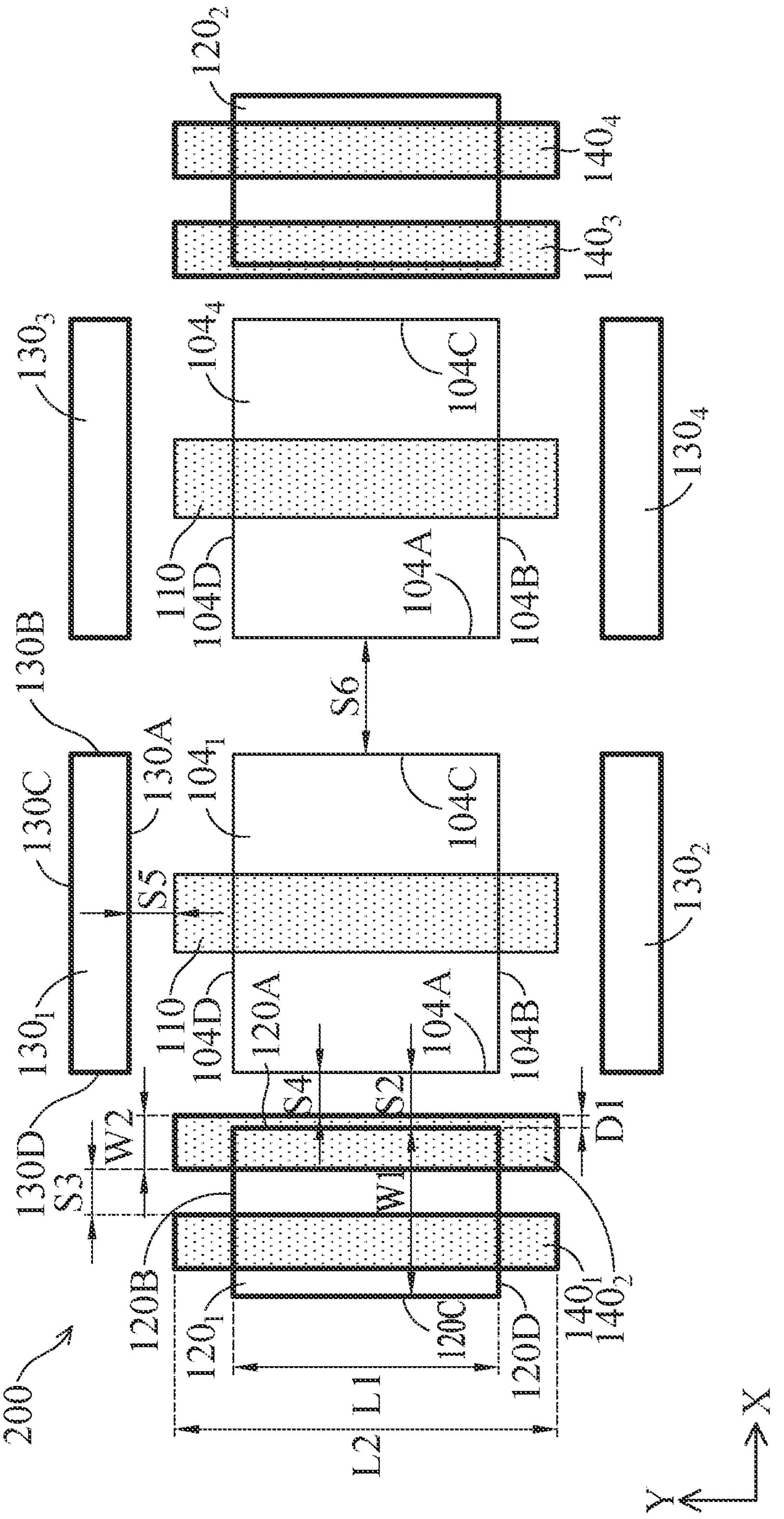
FIGS. 2-6 show plan views illustrating semiconductor structures according to some embodiments of the present invention.

The semiconductor structure 200 of FIG. 2 is similar to the semiconductor structure 100 of FIG. 1A except that the semiconductor structure 200 includes an active region $\mathbf{104}_4$. For the sake of simplicity, the active regions $\mathbf{104}_2$, $\mathbf{104}_3$ are not shown in FIG. 2.

The sidewall 104C of the active region $\mathbf{104}_1$ is immediately adjacent to the sidewall 104A of the active region $\mathbf{104}_4$. The edge 104D of the active region $\mathbf{104}_1$ is aligned with the edge 104D of the active region $\mathbf{104}_4$, and the edge 104B of the active region $\mathbf{104}_1$ is aligned with the edge 104B of the active region $\mathbf{104}_4$. The active region $\mathbf{104}_1$ is separated from the active region $\mathbf{104}_2$ by a distance S6 in the X direction. In some embodiments, the distance S6 is less than a second predetermined value, for example, less than 0.6 μm. Accordingly, no dummy active region is disposed between the active region $\mathbf{104}_1$ and the active region $\mathbf{104}_4$.

The dummy active regions $\mathbf{130}_4$, $\mathbf{120}_2$, and $\mathbf{130}_3$ are respectively disposed immediately adjacent to the three edges 104B, 104C, and 104D of the active region $\mathbf{104}_4$. The configuration relationship between the dummy active regions $\mathbf{130}_4$, $\mathbf{120}_2$, $\mathbf{130}_3$, and the active region $\mathbf{104}_4$ may be similar to that described above in FIG. 1A.

Figure 3:
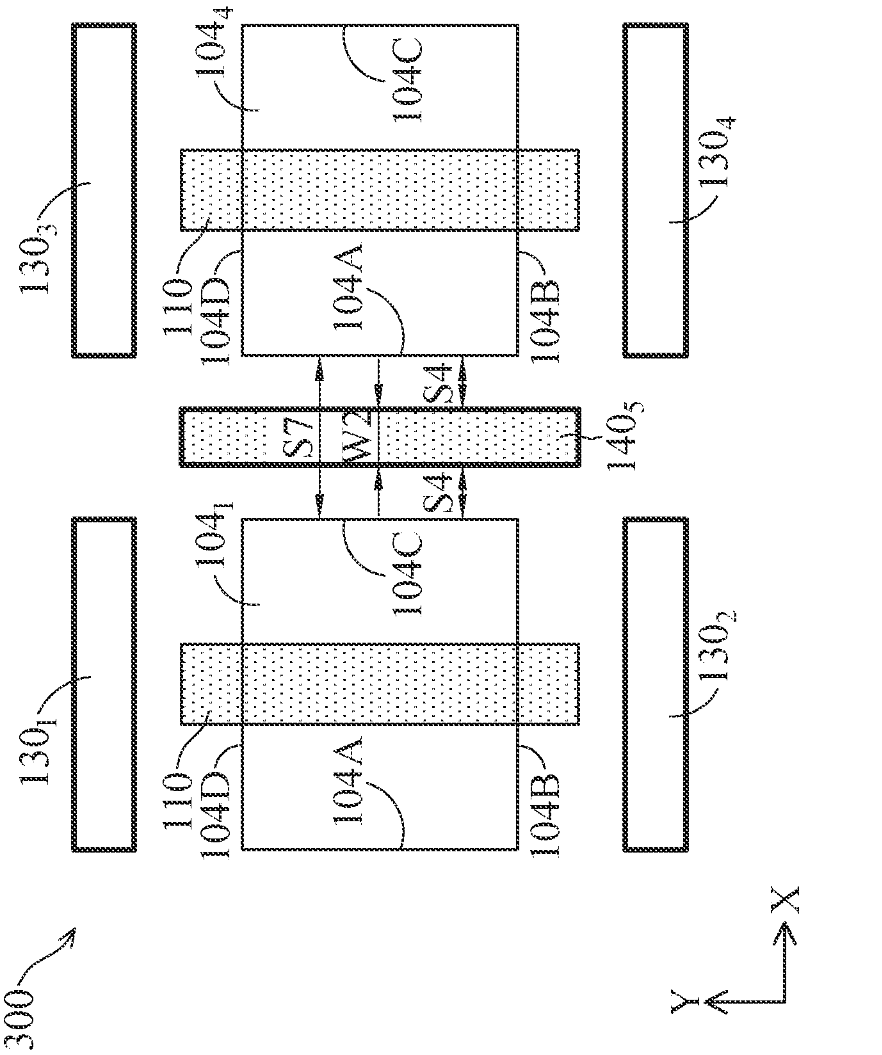

The semiconductor structure 300 of FIG. 3 is similar to the semiconductor structure 200 of FIG. 2, except that the active region 104$_1$ and the active region 104$_2$ are separated by a distance S7 between the first predetermined value and the second predetermined value in the X direction. Accordingly, the dummy gate structure 140$_5$ is disposed between the active regions 104$_1$ and 104$_4$. For brevity, FIG. 3 does not show the dummy active regions 120$_1$, 120$_2$ and the dummy gate structures 140$_1$, 140$_2$, 140$_3$, 140$_4$. In some embodiments, the distance S7 is, for example, between 0.6 and 0.75 μm.

Since the distance S7 is between the first predetermined value and the second predetermined value, there is no need to dispose a dummy active region between the active region 104$_1$ and the active region 104$_4$. Therefore, no dummy active region is disposed directly below the dummy gate structure 140$_5$. The dummy gate structure 140$_5$ is formed over the isolation structure 106 and in direct contact with the isolation structure 106.

Figure 4:
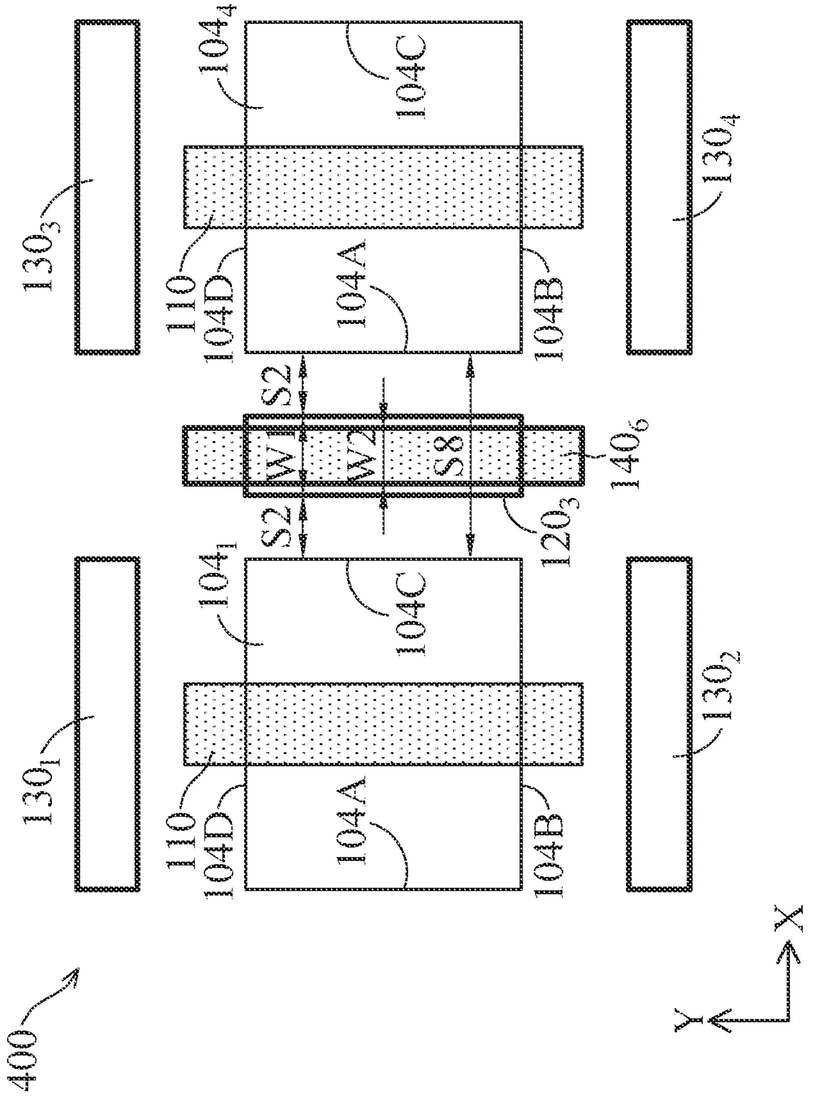

The semiconductor structure 400 in FIG. 4 is similar to the semiconductor structure 300 in FIG. 3, except that the active region 104$_1$ and the active region 104$_2$ are be separated by a distance S8 in the X direction, and the distance S8 is greater than the first predetermined value, for example, between 0.75 and 1 μm. In one embodiment, the distance S8 may be less than the distance S1.

The dummy active region 120$_3$ is disposed between the active regions 104$_1$ and 104$_4$. The opposite edges of the dummy active region 120$_3$ in the Y direction may be aligned with the edges 104B and 104D of the active region 104$_1$ (or the edges 104B and 104D of the active region 104$_4$), respectively. A dummy gate structure 140$_6$ is disposed over the central portion of the dummy active region 120$_3$. The distance between the dummy gate structure 140$_6$ and the active region 104$_1$ (or the active region 104$_4$) in the X direction is greater than the distance S2.

Figure 5:
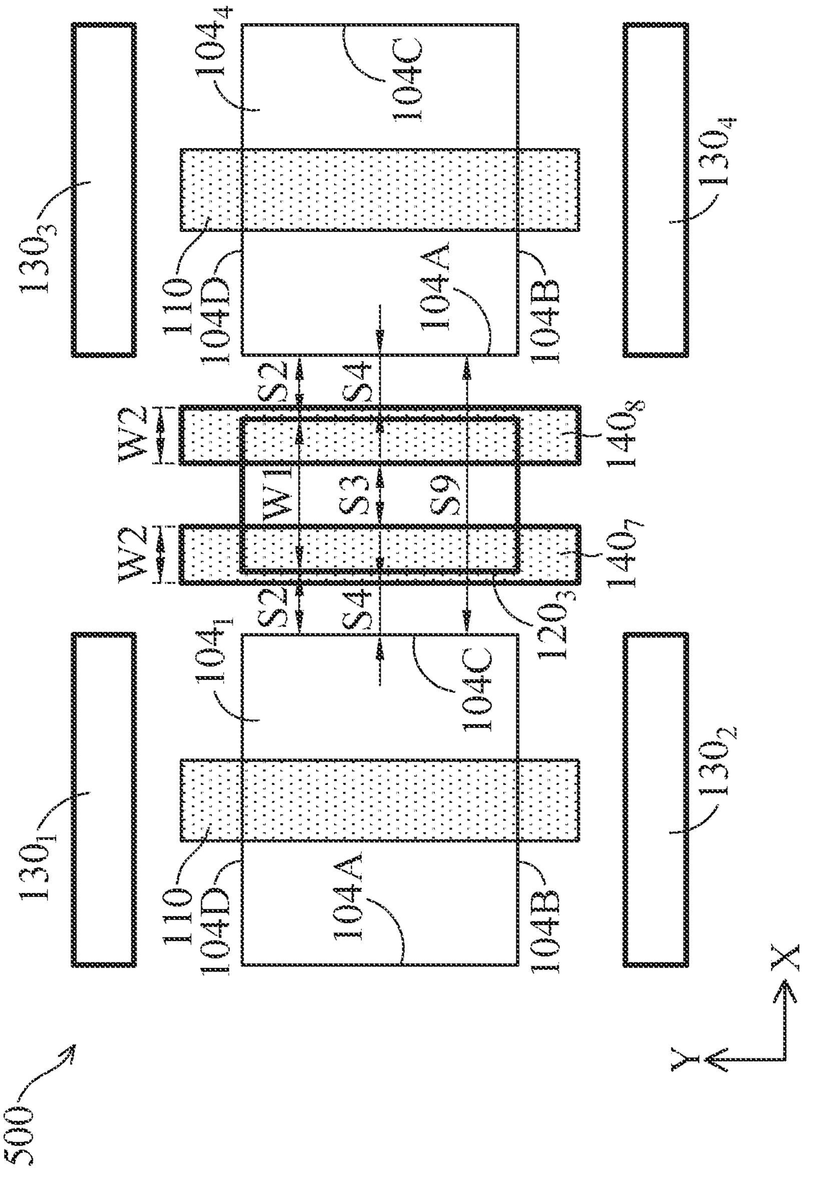

The semiconductor structure 500 in FIG. 5 is similar to the semiconductor structure 400 in FIG. 4, except that the active region 104$_1$ and the active region 104$_2$ are separated by a distance S9 in the X direction, the distance S9 is greater than a third predetermined value, and the third predetermined value is greater than the first predetermined value. In some embodiments, the distance S9 is, for example, between 0.96 and 1.23 μm.

Two dummy gate structures 140$_7$ and 140$_8$ are disposed over the edge portion of the dummy active region 120$_3$. The active region 104$_1$| is separated from the dummy gate structure 140$_7$ by a distance S4 in the X direction, and the active region 104$_4$ is separated from the dummy gate structure 140$_8$ by the distance S4 in the X direction. The dummy gate structures 140$_7$ and 140$_8$ are separated by the distance S3 in the X direction.

Figure 6:
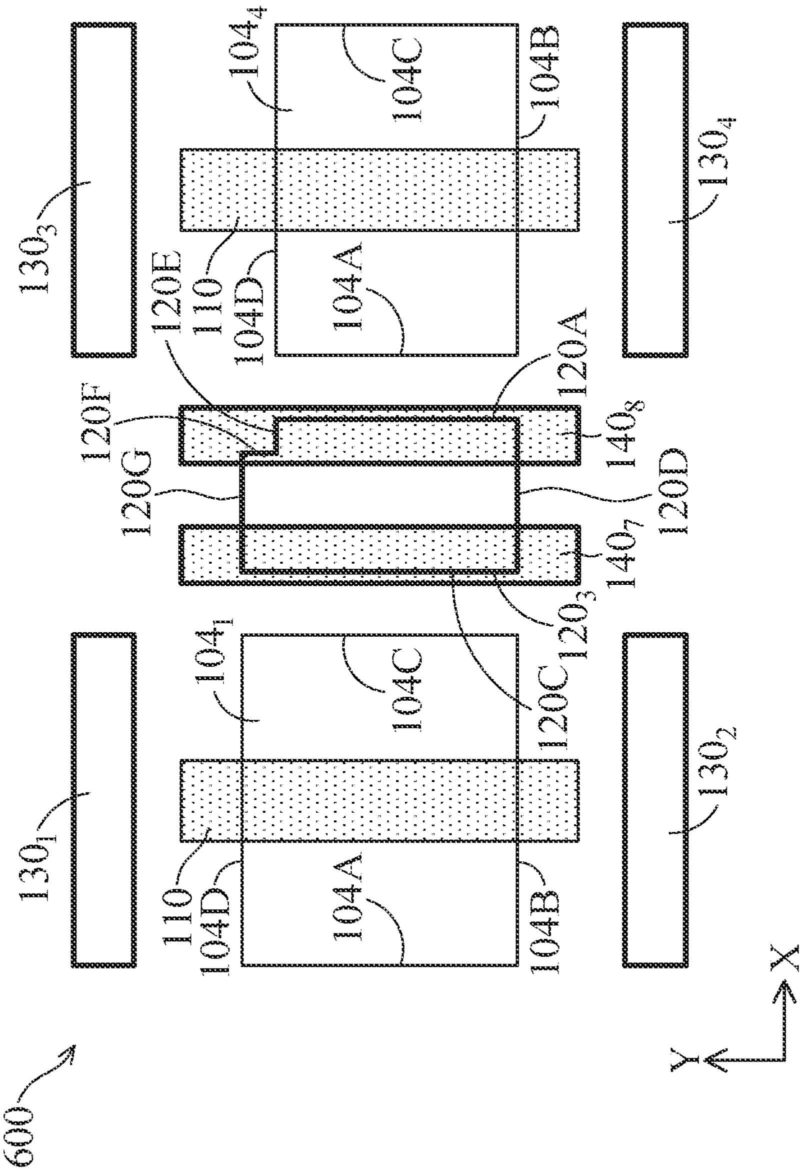

The semiconductor structure 600 in FIG. 6 is similar to the semiconductor structure 500 in FIG. 5, except that the edge 104D of the active region 104$_1$ is not aligned with the edge 104D of the active region 104$_4$.

The dummy active region 120$_3$ has a polygonal profile in a plan view, and the edges 120E, 120F, 120G of the dummy active region 120$_3$ form a stepped shape. The edge 120F extends in the Y direction, while the edges 120E and 120G extend in the X direction. The edge 120G of the dummy active region 120$_3$ may be aligned with the edge 104D of the active region 104$_1$, and the edge 120E of the dummy active region 120$_3$ may be aligned with the edge 104D of the active region 104$_4$.

Accordingly, in the embodiments of the present invention, the dummy active region is disposed immediately adjacent to the periphery of the active region to reduce the variation of the sidewall angle between the active regions. Therefore, the difference in performance between transistors is improved.

The present invention is suitable for making miniaturized chip, for example a flash memory device, but the invention is not limited thereto, so as to increase the total number of dies on a wafer. Therefore, the production cost and energy consumption of manufacturing a single IC are reduced, and the production energy consumption of subsequent packaging is also reduced, thereby reducing carbon emissions in the process of producing IC. Besides, since the leakage current between the gate structure and the dummy active region is avoided, the present invention provides a sustainable semiconductor device.

Although the present invention has been disclosed above with the disclosed embodiments, it is not intended to limit the present invention. A person of ordinary skill in the art of the present invention can make some changes and modifications without departing from the spirit and scope of the present invention. Therefore, the scope of protection of the present invention should be defined by the scope of the appended patent application.

What is claimed is:

1. A semiconductor structure, comprising:

a first active region disposed over a substrate, wherein the first active region has a first edge extending in a first direction, and a second edge connected to the first edge and extending in a second direction, wherein the first direction is perpendicular to the second direction;

a first gate structure extending over the first active region in the first direction;

a first dummy active region disposed over the substrate, wherein the first dummy active region has a first edge extending in the first direction and immediately adjacent to the first edge of the first active region;

a second dummy active region disposed over the substrate, wherein the second dummy active region has a first edge extending in the second direction and immediately adjacent to the second edge of the first active region;

a first dummy gate structure extending over the first dummy active region in the first direction, wherein a length of the first dummy gate structure in the first direction is longer than a length of the first dummy active region in the first direction, wherein a width of the first dummy gate structure in the second direction is smaller than a width of the first dummy active region in the second direction; and an isolation structure surrounding the first active region, the first dummy active region, and the second dummy active region, the isolation structure comprising a portion located between the first active region and the first dummy active region, and the first dummy gate structure covering an upper surface of the portion of the isolation structure.

2. The semiconductor structure of claim 1, wherein the first dummy gate structure covers the first edge of the first dummy active region.

3. The semiconductor structure of claim 1, further comprising:

a second dummy gate structure extending over the first dummy active region in the first direction, wherein a distance between the first dummy gate structure and the second dummy gate structure is longer than a distance between the first dummy gate structure and the first active region.

4. The semiconductor structure of claim 1, wherein the first dummy active region has a second edge connected to the first edge of the first dummy active region and extending in the second direction, and the second edge of the first dummy active region is aligned with the second edge of the first active region.

5. The semiconductor structure of claim 1, wherein no dummy gate structure is disposed over the second dummy active region.

6. The semiconductor structure of claim 1, wherein the second dummy active region has a second edge connected to the first edge of the second dummy active region and extending in the first direction, and a size of the second edge of the second dummy active region is smaller than a size of the first edge of the second dummy active region.

7. The semiconductor structure of claim 6, wherein the second edge of the second dummy active region is aligned with the first edge of the first active region.

8. The semiconductor structure of claim 1, further comprising:

an interconnect structure disposed over the first active region, the first gate structure, the first dummy active region, and the second dummy active region, wherein the interconnect structure is electrically connected to the first active region and the first gate structure, and is electrically isolated from the first dummy active region and the second dummy active region.

9. The semiconductor structure of claim 1, further comprising:

a second active region disposed over the substrate; and a dummy gate structure disposed between the first active region and the second active region, wherein no dummy active region is disposed below the dummy gate structure.

10. The semiconductor structure of claim 1, further comprising:

a second active region disposed over the substrate, wherein the second active region has a first edge extending in the second direction; and a third dummy active region disposed between the first active region and the second active region, wherein the third dummy active region comprises:

a first edge extending in the second direction and aligned with the second edge of the first active region;

a second edge extending in the second direction and aligned with the first edge of the second active region; and a third edge connecting the first and second edges of the third dummy active region to form a stepped shape.

11. A semiconductor structure, comprising:

a first active region, a dummy active region, and a second active region sequentially arranged over a substrate in a first direction; a first gate structure extending over the first active region in a second direction, wherein the second direction is perpendicular to the first direction;

a second gate structure extending over the second active region in the second direction;

a first dummy gate structure extending over the dummy active region in the second direction, wherein a length of the first dummy gate structure in the second direction is longer than a length of the first dummy active region in the second direction, wherein a width of the first dummy gate structure in the first direction is smaller than a width of the first dummy active region in the first direction; and an isolation structure surrounding the first active region, the dummy active region, and the second active region, the isolation structure comprising a portion located between the first active region and the dummy active region, and the first dummy gate structure covering an upper surface of the portion of the isolation structure.

12. The semiconductor structure of claim 11, wherein a distance between the first dummy gate structure and the first active region is longer than a distance between the dummy active region and the first active region.

13. The semiconductor structure of claim 11, wherein a distance between the first dummy gate structure and the first active region is shorter than a distance between the dummy active region and the first active region.

14. The semiconductor structure of claim 13, further comprising:

a second dummy gate structure extending over the dummy active region in the second direction, wherein a distance between the second dummy gate structure and the second active region is shorter than a distance between the dummy active region and the second active region.

15. The semiconductor structure of claim 13, wherein the dummy active region has an edge facing the first active region, and the first dummy gate structure extends a distance beyond the edge of the dummy active region in the first direction.

16. The semiconductor structure of claim 11, further comprising:

an interlayer dielectric layer covering the first active region, the dummy active region, the second active region, the first gate structure, and the second gate structure; and a first contact plug and a second contact plug located in the interlayer dielectric layer and respectively disposed over the second active region and the second gate structure, wherein no contact plug is disposed over the dummy active region.

17. The semiconductor structure of claim 11, wherein the first active region is separated from the second active region by a first distance, the dummy active region is separated from the second active region by a second distance, and a ratio of the second distance to the first distance is less than 0.33.

* * * * *